United States Patent [19]

Mumper et al.

[11] Patent Number: 5,223,748
[45] Date of Patent: Jun. 29, 1993

[54] BATTERY MANAGER

[75] Inventors: Eric W. Mumper, Dallas; Donald R. Dias, Carrollton; Hal Kurkowski, Dallas, all of Tex.

[73] Assignee: Dallas Semiconductor Corp., Dallas, Tex.

[21] Appl. No.: 623,517

[22] Filed: Dec. 11, 1990

[51] Int. Cl.5 .............................................. H02J 9/04
[52] U.S. Cl. ......................................... 307/64; 307/66; 371/66
[58] Field of Search ................... 307/44, 48, 64, 66, 307/75, 86, 87; 320/5, 10; 361/8, 13; 371/66; 315/86

[56] References Cited

U.S. PATENT DOCUMENTS

| | | | |
|---|---|---|---|
| 4,383,184 | 5/1983 | McFarland | 307/66 |
| 4,486,689 | 12/1984 | Davis et al. | 307/66 |
| 4,587,640 | 5/1986 | Saitoh | 371/66 |
| 4,673,823 | 6/1987 | Masson | 307/66 |
| 4,730,121 | 3/1988 | Lee et al. | 307/66 |
| 5,073,837 | 12/1991 | Baek | 307/66 |

Primary Examiner—A. D. Pellinen
Assistant Examiner—Richard T. Elms
Attorney, Agent, or Firm—Worsham, Forsythe, Sampels & Wooldridge

[57] ABSTRACT

Battery monitor (100) with a transient pull down (172) for backup batteries which is active during power up and prevents the feedthrough charging of low or dead batteries causing a spurious power fail indication.

6 Claims, 5 Drawing Sheets

BATTERY MANAGER

BACKGROUND AND SUMMARY OF THE INVENTIONS

The present invention relates to electronic devices, and, more particularly, to semiconductor devices useful in controlling battery-backed circuitry.

Power failures for computer systems can lead to loss of all information held in volatile memory, and power surges can damage components. Thus power down and power up routines are typically built into computer systems, and sensors for power failures together with reset signal generators and battery backups are available. Known devices combine a power failure sensor and a battery switch that outputs a power fail signal when power supply voltage drops from about 5 volts down to about 3.75 volts and further switches to battery power when the power supply voltage drops to about 3 volts. The power fail signal can be used as a reset signal for microprocessors and microcontrollers and a battery backup can hold program and data in memory until the power supply is restored. See Lee and Dias, U.S. Pat. No. 4,730,121. Such devices can rely upon hystersis in the comparator to avoid erratic reset signals.

Such devices have a problem if the circuit for detecting the restoration of power supply voltage is based on a lithium battery and the battery is discharged. Indeed, a locked in power fail signal is possible on power up because the switches isolating the battery from the power supply are inoperative, and the rising power supply voltage can charge up a lithium battery to a level that indicates a power failure because a lithium battery discharges to an open circuit state rather than a short circuit state.

The present invention provides a battery discharge current for both fast rising and slow rising power supply voltages.

BRIEF DESCRIPTION OF THE DRAWINGS

The present invention will be described with reference to the accompanying drawings, which show important sample embodiments of the invention and which are incorporated in the specification hereof by reference, wherein.

DESCRIPTION OF THE PREFERRED EMBODIMENTS

Figure 1:
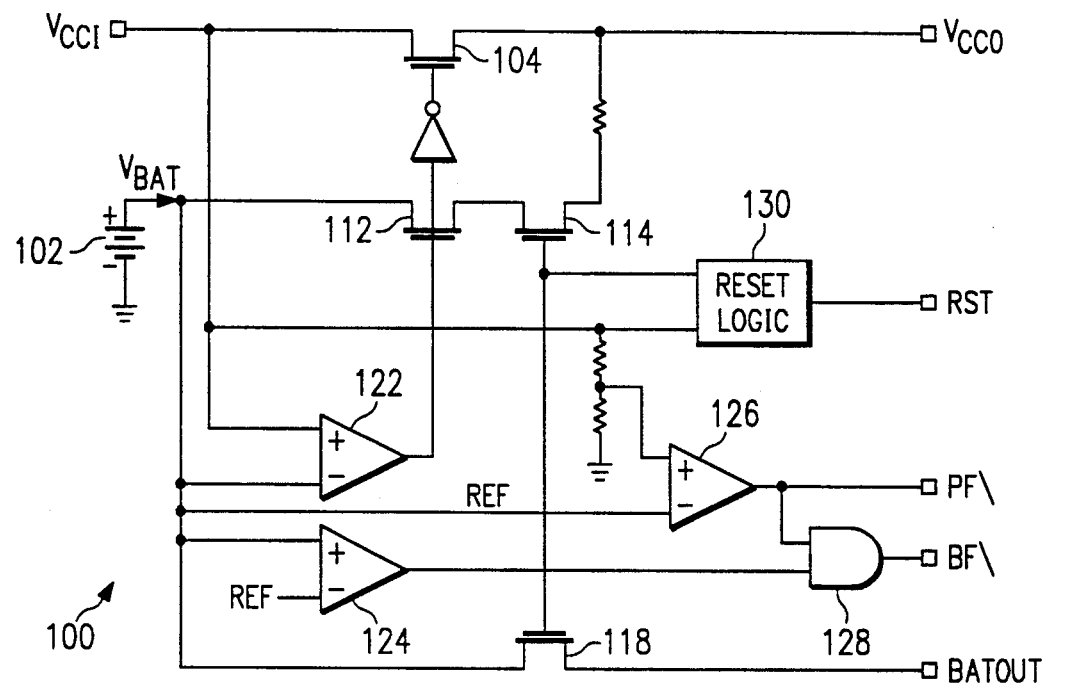
FIG. 1 is a functional block circuit diagram of the first preferred embodiment battery manager.

FIG. 1 is a functional block circuit diagram of the first preferred embodiment battery manager, generally denoted by reference numeral 100, which includes power supply input terminal VCCI, battery input terminal VBAT (with external battery 102 shown connected), power output terminal VCCO, power fail output terminal PF (or PFB), battery fail output terminal BF (or BFB), battery output terminal BATOUT, reset terminal RST, p-channel FETs 104, 112, 114, and 118, comparators 122, 124, and 126, AND gate 128, and Reset Logic 130. During normal operation, VCCI connects to the primary energy source (at typically 5 volts above ground) and power is supplied to VCCO through switch FET 104; a voltage drop of perhaps 0.2 volt may occur from VCCI to VCCO at current levels of about 250 mA. PF is held high to indicate that the voltage at VCCI is within tolerance of the nominal 5 volts.

If the voltage at VCCI falls below the trip point of about 1.26 times the voltage at VBAT (e.g., 3.75 volts) as detected by comparator 126, then the power fail signal at PF is driven low. This signal may provide a reset signal for a microprocessor or microcontroller.

If the voltage at VCCI continues to fall below the battery voltage (e.g., 3 volts), input power is switched from VCCI to VBAT by turning off FET 104 and turning on FET 112, and the external battery 102 provides power to VCCO if and only if FET 114 is on. FET 114 is turned on by the voltage at VCCI falling below the battery voltage except when manager 100 has been reset as described below.

On power up, as the voltage at VCCI rises above the voltage at VBAT, the power input switches from VBAT back to VCCI again by comparator 122 turning on FET 104 and turning off FET 112. And as the voltage at VCCI rises above the trip point, comparator 126 drives PF high.

When power is being supplied from the primary energy source, the voltage at BF is held high provided that battery 102 outputs at least 2 volts at terminal VBAT. If the level of battery 102 falls below 2 volts, then comparator 124 will drive the signal at BF low to indicate a discharged battery. Also, if PF is low, then AND gate 128 insures that BF also is low regardless of the level of battery 102. During normal operation battery 102 is connected to terminal BATOUT by a turned-on FET 118.

Figure 2:
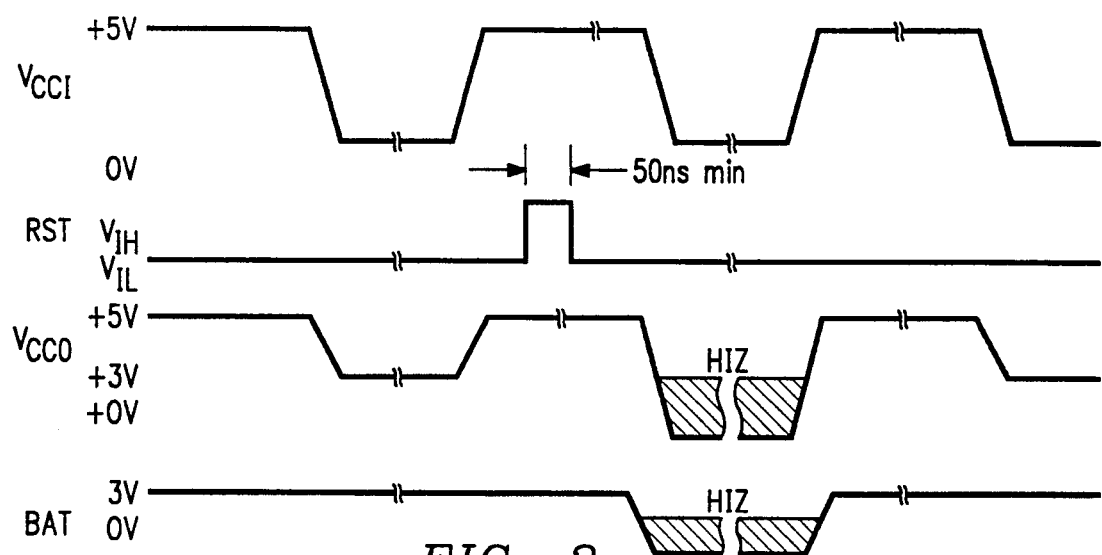
FIG. 2 is a timing diagram for the operation of the first preferred embodiment.
Figure 3:
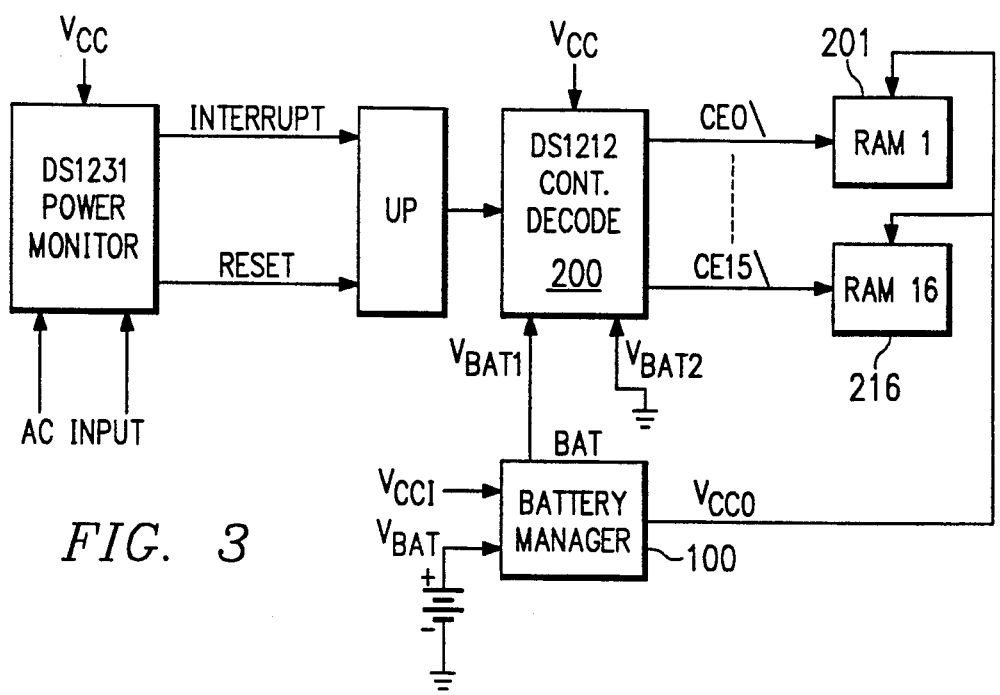
FIG. 3 shows the first preferred embodiment in an application.

Reset Logic 130 may be used to prevent the battery 102 from supplying power to VCCO and BATOUT even if VCCI falls below the level of battery 102. This reset feature finds application during shipping and handling of manager 100 to avoid accidental discharging of battery 102. Applying a 50 nsec high pulse at terminal RST while VCCI is within tolerance switches Reset Logic 130 to a state where FETs 114 and 118 are turned on; and removal of the primary power supply from terminal VCCI drives terminals VCCO and BATOUT to a high impedance state. However, when the voltage at VCCI again rises to above the level of battery 102, Reset Logic switches back to normal operating conditions, and VCCO and BATOUT again may supply power. FIG. 2 is a timing diagram illustrating the Reset Logic operation; and FIG. 3 shows an application of manager 100 with a memory controller 200 and memory chips 201–216.

Figure 7:
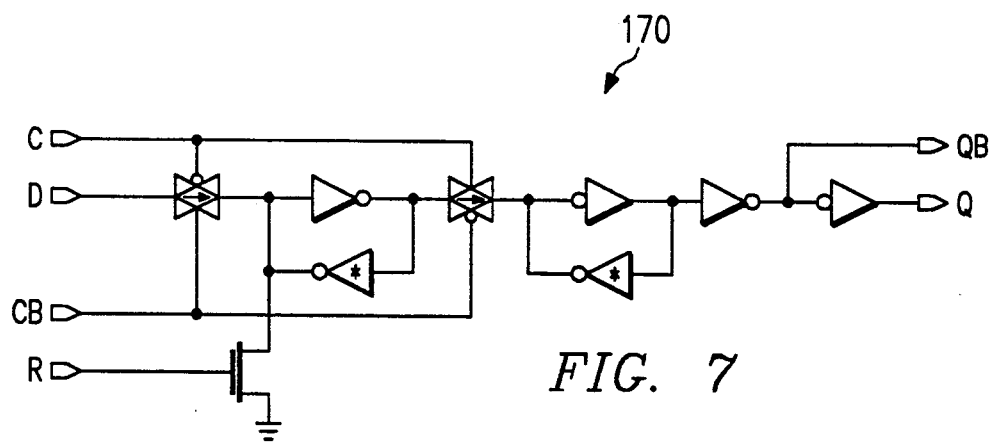
FIGS. 5–8 are schematic diagrams of the blocks shown in FIG. 4.
Figure 8:
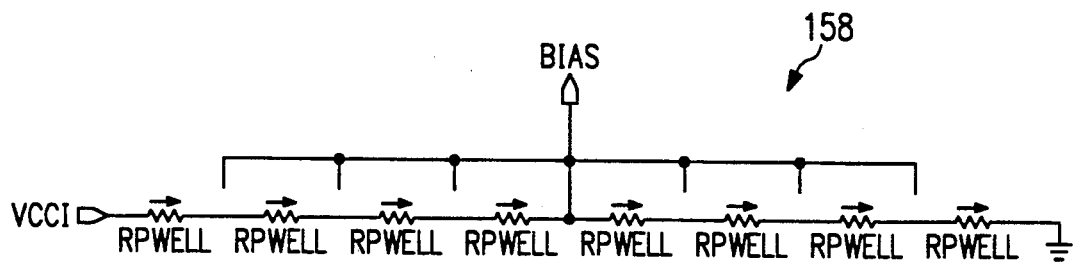
Figure 4A:
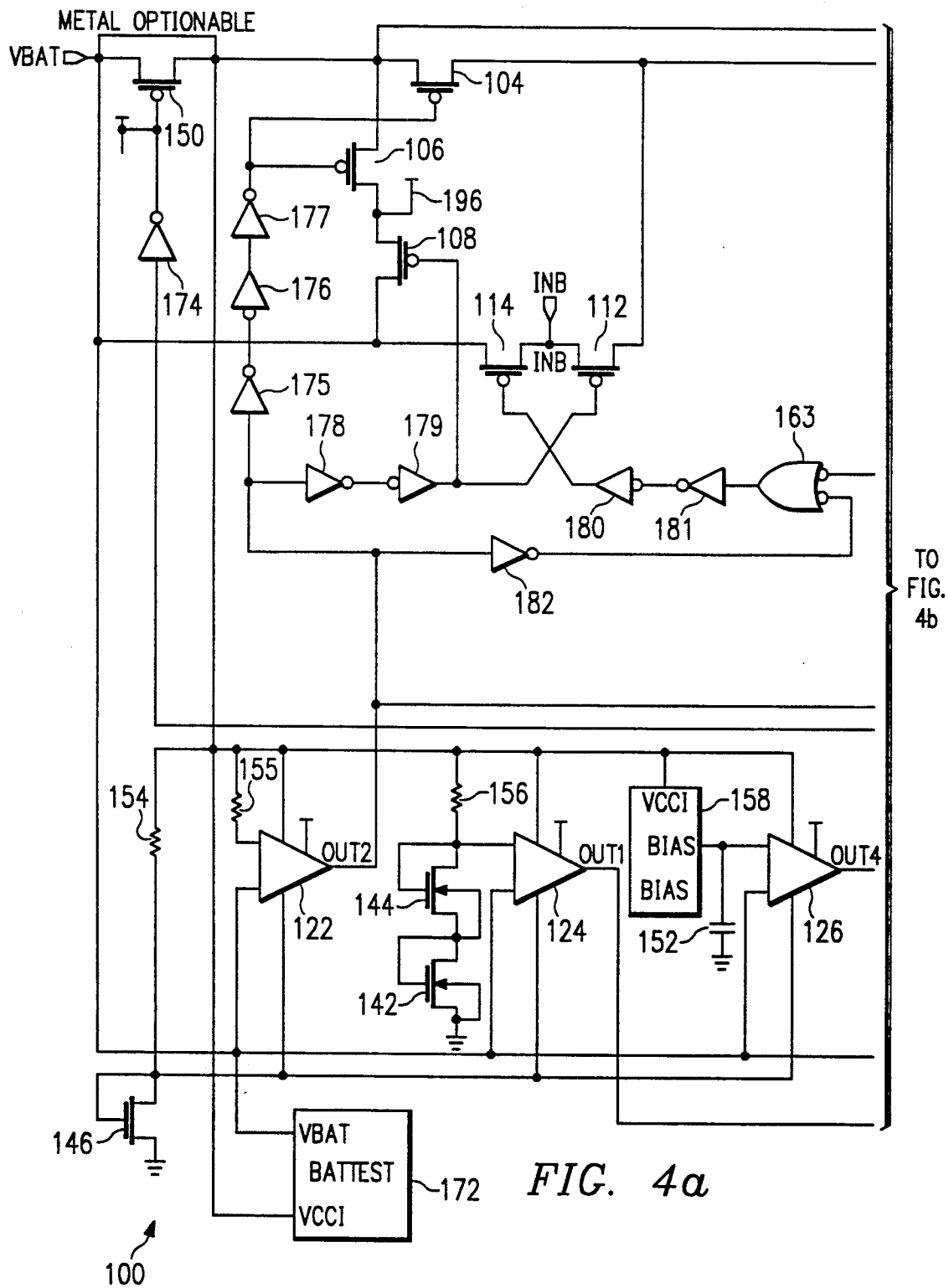
FIGS. 4A and 4B are a structural block diagram of the first preferred embodiment.
Figure 4B:
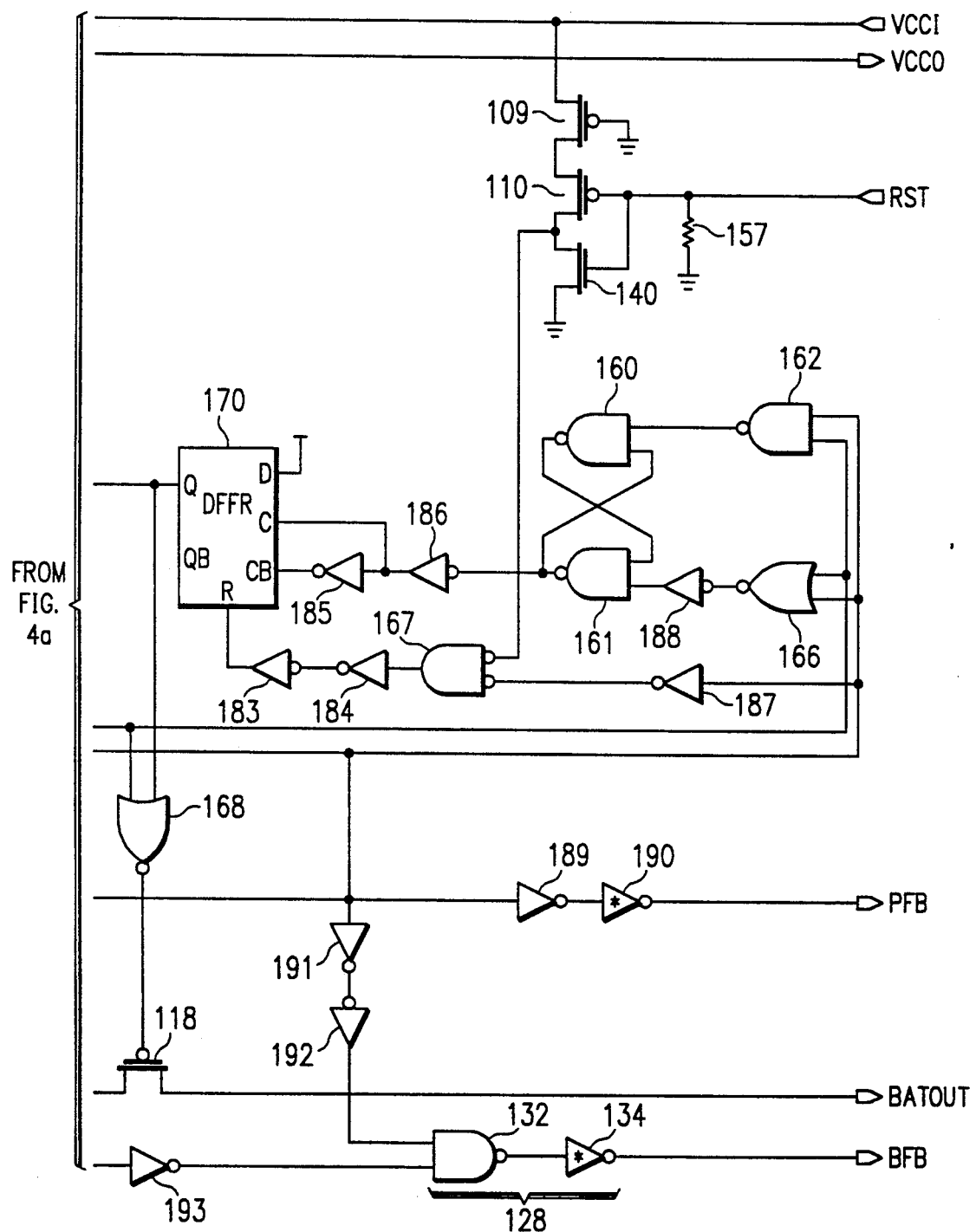

FIGS. 4A and 4B is a more detailed schematic diagram of manager 100 and shows p-channel FETs 104, 106, 108, 109, 110, 112, 114, and 118, identical comparators 122, 124, and 126 (see FIG. 6 for a schematic diagram of a comparator), AND gate 128 (made of NAND gate 132 plus inverter 134), n-channel FETs 140, 142, 144, and 146, capacitors 150 and 152, resistors 154–158 with resistor 158 being a voltage divider (see FIG. 8 for the selectable resistance ratios), NAND gate 160-163, NOR gates 166–168, flip-flop 170 (see schematic FIG. 7), battery level test circuit 172, and inverters 174-193.

The detailed operation of manager 100 is as follows. First presume a power supply of 5 volts (relative to ground) at terminal VCCI, a battery of 3 volts at terminal VBAT, and flip-flop 170 in the Q=1 state (that is, the voltage at the Q output is at the internal power supply voltage, presumed to be about 5 volts). The Q=1 state will be seen below to be the VCCI power up condition for flip-flop 170 with a 3 volt battery at VBAT. The 5 volts at VCCI provides through FET 106 the internal power voltage at node 196. The 5 volts at VCCI feeds through resistor 155 to the positive (P) input of comparator 122 and the 3 volts at VBAT feeds to the negative (M) input of comparator 122. (The operation of comparators 122, 124, and 126 is described below in connection with FIG. 6.) Thus the output of comparator 122 is high (about 5 volts) and this is inverted by inverters 175-177 to apply a low (about ground) to the gate of FET 104 and thereby turn it on to connect VCCI to VCCO and provide power at VCCO. FET 104 has a gate width of 185,000 and gate length of 3, expressed in um and a turned-on resistance of only about 1 ohm. Large currents will cause the power output voltage at VCCO to be somewhat less than the 5 volts in at VCCI. The inverted output of comparator 122 also turns on FET 106 to provide the internal power voltage; note that this is self-starting because FETs 104 and 106 are turned on with a low at their gates. The high output of comparator 122 is buffered but not inverted by inverters 178-179 and applied to the gates of FETs 108 and 112; this isolates VBAT from VCCO and internal node 196.

A high output of comparator 122 also drives NOR gate 168 low to turn on FET 118 and connect BATOUT to VBAT, and thus make the 3 volt battery power at VBAT available at terminal BATOUT while VCCI is at 5 volts.

Resistor 158 divides the voltage at VCCI (see FIG. 8) and feeds about 0.8 VCCI voltage (about 4 volts) to the positive input of comparator 126; the voltage at VBAT (3 volts) feeds the negative input. Thus the output of comparator 126 is high and drives, through inverters 189 and 190, terminal PFB high.

A low input at terminal RST is inverted by the inverter made of FETs 110 and 140 at drives NOR gate 167 low. The low of NOR gate 167 is buffered by inverters 183 and 184.

The high outputs of comparators 122 and 126 force NOR gate 166 and NAND gate 162 both low. This makes NAND gate 160 high and cross-coupled NAND gate 161 low.

The 5 volts at VCCI gives rise to a current of about 11 uA through 450 kohm resistor 156 and diode connected FETs 142 and 144. The threshold voltages of FETs 142 and 144 are each about 1 volt, and the 2 volt drop across them feeds into the positive input of comparator 124. The voltage at VBAT feeds the negative input of comparator 124, so if the voltage of a battery connected to VBAT falls below 2 volts comparator will switch from a low output to a high output. A high output of comparator 124, inverted by inverter 193, drives NAND gate 132 high and, through inverter 134, output BFB low to indicate a low battery voltage. Also, a low output of comparator 126 due to a falling voltage at VCCI will drive NAND gate 132 high and output BFB low regardless of the voltage level of a battery at VBAT.

The 5 volts at VCCI also provides a current of about 70 uA through 70 kohm resistor 154 and diode connected FET 146; this current is mirrored in each of comparators 122, 124, and 126 by FETs 302, 304, 306, and 308 (see FIG. 6) with FET 304 having twice the channel width and thus twice the current of FET 146.

Power up at VCCI in the case of a low or discharged battery at VBAT could be expected to have a problem with capacitive coupling of VBAT through active semiconductor areas to VCCI. This permits VCCI to charge up the battery at VBAT. But then the voltage at VBAT tracks the voltage at VCCI, whereas comparator 126 compares approximately 80% of the voltage at VCCI to the voltage at VBAT. Hence, comparator 126 would output a low as it becomes active and this persists as VCCI approaches 5 volts. Such a low signal at PFB indicates a power failure, but none exists. This spurious power failure signal could cause a system to pull down the voltage at VCCI for a reset time interval and then let it rise again. Of course, such operation will deadlock the system. BATTEST block 172 of manager 100 prevents such deadlock and operates as follows.

Figure 5:
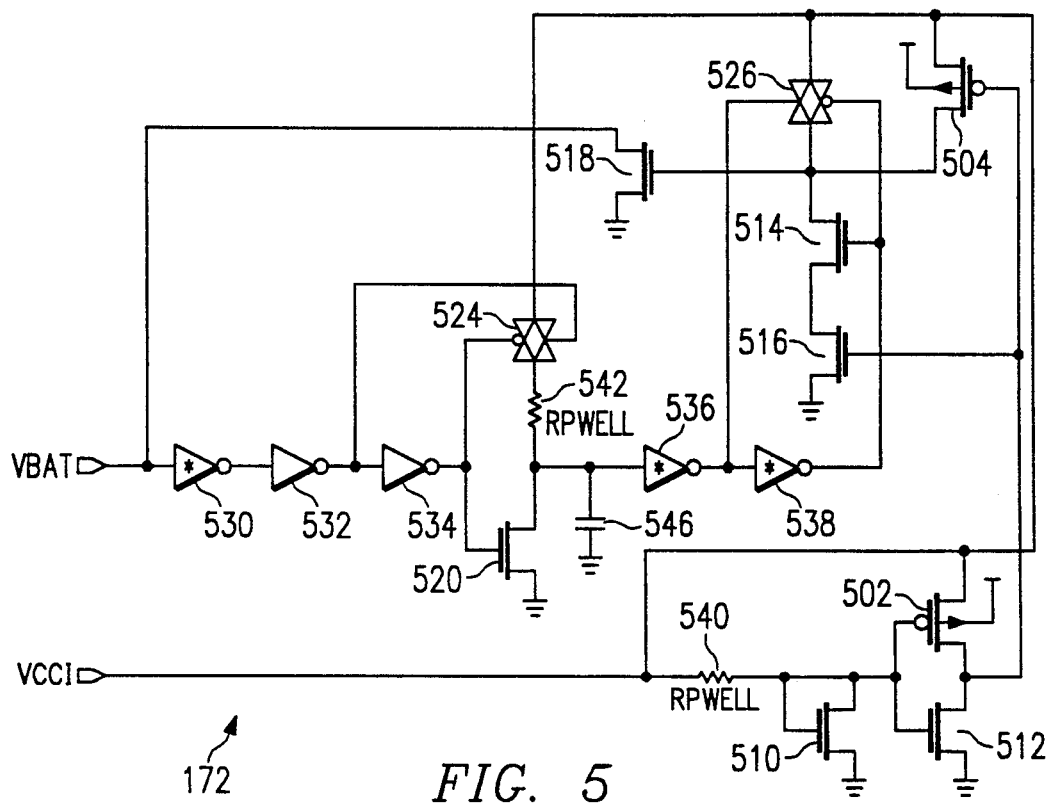

FIG. 5 schematically shows BATTEST block 172 which includes terminals VBAT and VCCI (connected to the terminals of the same names in FIG. 4), p-channel FETs 502 and 504, n-channel FETs 510, 512, 514, 516, 518, and 520, transmission gates 524 and 526, inverters 530, 532, 534, 536, and 538, resistors 540 and 542, and capacitor 546. First consider normal conditions with the battery connected to VBAT fully charged (3 volts) and providing the internal power supply. Transmission gate 524 will be conducting and present an RC load to VCCI with R being resistor 542 and C being capacitor 546, and transmission gate 526 will be conducting and FET 514 off to make the gate of FET 518 track the voltage at VCCI. The resistance of resistor 542 is about 1 megohm and the capacitance of capacitor 546 is about 100 pF, so the RC time constant is about 100 usec. Note that FET 520 is turned off when transmission gate 524 is turned on and vice versa. Now if the voltage at VCCI is near ground but begins rising rapidly (time constant less than 100 usec), then capacitor 546 will not charge up as fast as VCCI is rising and transmission gate 526 will remain conducting for up to 100 usec. FET 518 will turn on once the voltage at VCCI reaches its threshold voltage (about 1 volt) and stay on for a transient time interv until capacitor 546 is charged up enough to switch inverter 536 low. During this transient time interval FET 518 pulls VBAT down towards ground, but FET 518 has a small gate width to length ratio (9/360 in um) and an on resistance of 150K ohms, so the drain on the battery is not significant and the drop in voltage from 3 volts at VBAT is negligible. Once capacitor 546 is charged up, transmission gate 526 becomes nonconducting and the gate of FET 518 is disconnected from VCCI, and FET 518 turns off. Note that a rapid rise in the voltage of VCCI towards 5 volts activates the inverter made of FETs 502 and 512 and also provides a low input (the approximate 1 volt drop across diode-connected FET 510). This inverter thus outputs a high (equal to the voltage at VCCI) that insures FET 504 is turned off and FET 516 is turned on and lets the charge on capacitor 546 determine the state of FET 518.

If the voltage at VCCI is near ground but begins rising slowly (time constant typically several msec), then capacitor 546 will track VCCI and when the voltage at VCCI reaches about 2 volts, FET 518 will be turning on, but inverter 536 will turning off to make transmission gate 526 nonconducting and turn on FET 514. However, at these levels the inverter made of FETs 502 and 512 will acutally have a high input because the source-to-gate voltage of n-channel FET 512 will be closer to threshold than that of p-channel FET 502, and this inverter will output a low of about 1 volt that turns on FET 504 and keeps FET 516 off. Thus the voltage at VCCI is still applied to the gate of FET 518 and it continues the transient pull down of the battery. The pull down continues until the voltage on VCCI has risen to about 3 volts when inverter 502-512 goes high and turns off FET 504 and turns on FET 516 to pull the gate of FET 518 to low and terminate the pull down of VBAT. In short, during normal operation (battery at 3 volts), circuit 172 provides a transient pull down of the battery through 150K ohm FET 518 as the voltage at VCCI rises from ground past 3 volts. This pull down has minimal effect on the battery or the 3 volts at VBAT, and once VCCI has passed about 3.75 volts, comparator 126 switches the output at PFB to high.

The condition of a low or discharged battery differs but is analogous. Thus with the voltage at both VCCI and VBAT below about 1 volt, the primary conduction FETs 104, 112, and 114 may be close to turned on so that as the voltage at VCCI rises it charges the battery and VBAT tracks VCCI. Note that FETs 104, 112, and 114 have very large gate areas and capacitances and require large drive currents for switching. Now as the voltage begins rising, various FETs become active because the threshold voltages are all about 1 volt. In particular, a low battery implies a high gate voltage for FET 520 which discharges capacitor 546, but once VBAT reaches the threshold of inverter 530 (which is about 1.25 volts due to the gate width-to-length ratio of the n-channel FET being one hundred times the ratio of the p-channel FET), FET 520 is turned off and transmission gates 524 and 526 are turned on and VCCI has the RC load. Thus as previously described, while capacitor 546 is charging (up to 100 usec) FET 518 transiently pulls down VBAT. In contrast to the normal condition, a low or discharged battery condition implies that the pull down of VBAT by FET 518 is effective and keeps the voltage at VBAT down to roughly 2 volts as VCCI rises rapidly past 3 volts and this prevents comparator 126 from outputting a low at PFB as VCCI reaches 5 volts. Similarly, if the rise of the voltage at VCCI (and VBAT initially) is slower, then again the inverter formed by FETs 502 and 512 turns on FET 504 and thence FET 518 to transiently pull down VBAT while VCCI rises past 3 volts and this pull down is now effective due to the low condition of the battery. In short, with a low or discharged battery, the transient pull down keeps the voltage at VBAT low to preclude comparator 126 driving PFB low when VCCI reaches 5 volts.

Figure 6:
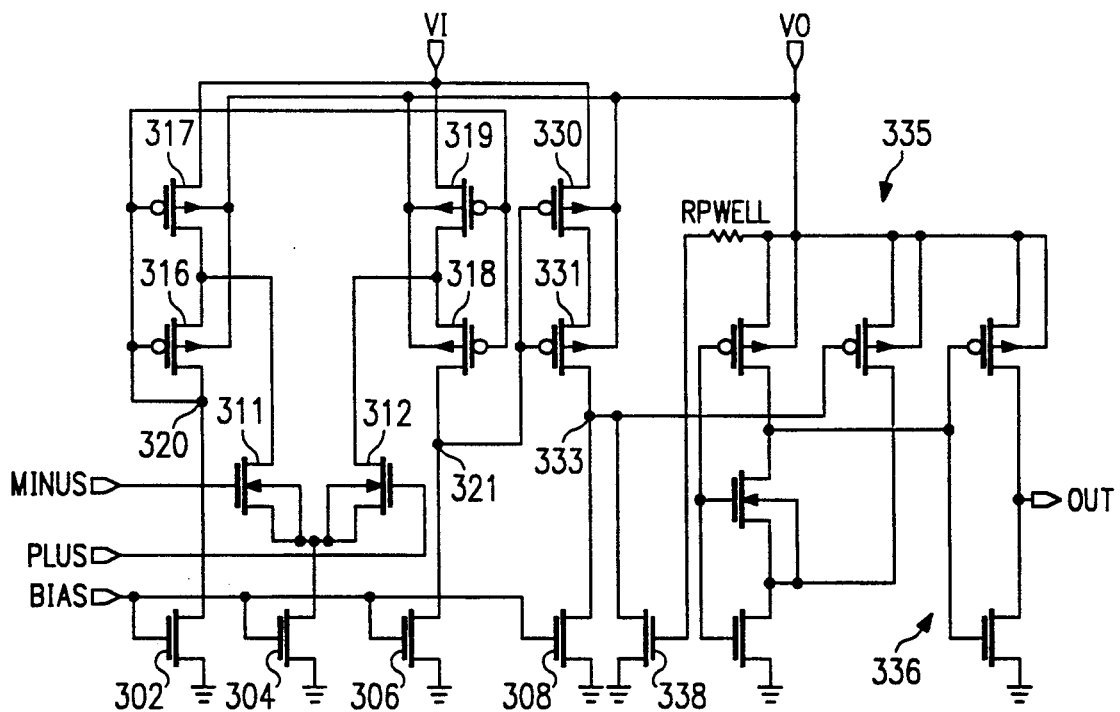

FIG. 6 schematically shows comparators 122, 124, and 126 which each includes current source n-channel FETs 302, 304, 306, and 308 which are biased by diode connected FET 146 through terminal B, differential input pair of n-channel FETs 311-312 connected to the negative (M) and positive (P) terminals, respectively, p-channel current mirror load FETs 316-319, amplifier driver p-channel FETs 330-331, inverters 335 and 336, high impedance FET 338, output terminal OUT, terminal VI connected to VCCI, and terminal VO connected to the internal supply of node 196. The input signals at terminals P and M determine the conductances of FETs 311 and 312 which divide the current from source 304. FETs 316-319 are arranged as an approximate current mirror load for FETs 311 and 312 by the connection of the gate and drain of FET 316 at node 320 which is connected to the gates of FETs 317-319. Thus the modulation of the division of the current from source 304 affects the voltage at node 321 in two ways: (i) the modulation of the current through FET 319 by FET 312 current and (ii) the modulation of the gate voltages of FETs 318-319 through the voltage at node 320 by FET 311 current. The voltage at node 321 is amplified by p-channel FETs 330 and 331 in series with current source 308, and the output at node 333 is fed to inverter 335 and then to inverter 336 to terminal OUT. Note that inverter 335 provides some hysteresis. N-channel FET 338 has a gate width to length ratio of 5/800 in um and provides a high impedance from node 333 to ground to avoid power up ambiguities.

Manager 100 may be fabricated with CMOS processing of silicon. The gate dimensions can be varied over a wide range, various CMOS processes such as metal, polysilicon or polycide gate, n-well, twin well, silicon-on-insulator, and so forth could be used.

FURTHER MODIFICATIONS AND VARIATIONS

The preferred embodiments may be modified in many ways while retaining one of more of the features of a transient battery pull down on power up. For example, multiple power supplies in parallel could be controlled; the backup power supply could be a fuel cell, solar cell, a combination of various sources, et cetera; only one of the two pull downs of the preferred embodiments could be used; the timing of a pull down could be by a clock and counter rather than by an RC delay; and so forth.

What is claimed is:

1. An integrated circuit, comprising:
   (a) an input power terminal;
   (b) a backup power terminal;
   (c) an output power terminal;
   (d) a first switch between said input power terminal and said output power terminal;
   (e) a second switch between said backup power terminal and said output power terminal;
   (f) pull down circuitry switchably connected to said backup power terminal; and
   (g) control circuitry transiently connecting said pull down circuitry to said backup power terminal when the potential of said input power terminal increases from a power fail level towards a power supply level.

2. The circuit of claim 1, wherein:
   (a) said control circuitry connects said pull down circuitry for a first predetermined time period if the time constant of increase of said potential is at most as large as said first predetermined time period.

3. The circuit of claim 2, wherein:
   (a) said first predetermined time period is determined by charging a fixed capacitor through a fixed resistor.

4. The circuit of claim 2, wherein:
   (a) said control circuitry connects said pull down circuitry for a second time period dependent upon said time constant of increase if said time constant of increase is greater than said second time period.

5. A method of managing a backup power supply, comprising the steps of:
   (a) sensing an increase in the potential of a primary power supply; and then
   (b) applying a transient pull down to a backup power supply.

6. The method of claim 5, wherein:
   (a) said transient pull down is for a fixed time period determined by charging a fixed capacitor through a fixed resistor.

* * * * *

UNITED STATES PATENT AND TRADEMARK OFFICE
CERTIFICATE OF CORRECTION

PATENT NO. : 5,223,748
DATED : Jun. 29, 1993
INVENTOR(S) : Mumper et al.

It is certified that error appears in the above-indentified patent and that said Letters Patent is hereby corrected as shown below:

Title page:

| | |
|---|---|
| Item [21] | Replace "623,517" With --625,517-- |
| Column 3, line 19 | Replace "um" With --$\mu$m-- |
| Column 3, line 50 | Replace "uA" With --$\mu$A-- |
| Column 3, line 66 | Replace "uA" With --$\mu$A-- |
| Column 4, line 32 | Replace "usec." With --$\mu$sec.-- |
| Column 4, line 38 | Replace "usec" With --$\mu$sec.-- |
| Column 4, line 40 | Replace "usec." With --$\mu$sec.-- |
| Column 4, line 43 | Replace "interv" With --interval-- |

UNITED STATES PATENT AND TRADEMARK OFFICE
CERTIFICATE OF CORRECTION

PATENT NO. : 5,223,748
DATED : Jun. 29, 1993
INVENTOR(S) : Mumper et al.

It is certified that error appears in the above-indentified patent and that said Letters Patent is hereby corrected as shown below:

Column 4, line 47   Replace "um"
With --$\mu$m--

Column 4, line 65   After "will"
Insert --be--

Column 4, line 68   Replace "acutally"
With --actually--

Column 5, line 35   Replace "usec."
With --$\mu$sec.--

Column 6, line 10   Replace "um"
With --$\mu$m--

Column 6, line 21   Replace the first occurrence of "of"
With --or--

Signed and Sealed this

Eighth Day of April, 1997

*Attest:*

BRUCE LEHMAN

*Attesting Officer*   *Commissioner of Patents and Trademarks*